(12) United States Patent
Khym

(10) Patent No.: US 7,074,633 B2
(45) Date of Patent: Jul. 11, 2006

(54) NITRIDE SEMICONDUCTOR LASER DIODE AND METHOD FOR MANUFACTURING THE SAME

(75) Inventor: Sungwon Khym, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/036,377

(22) Filed: Jan. 18, 2005

(65) Prior Publication Data
US 2005/0157768 A1 Jul. 21, 2005

(30) Foreign Application Priority Data
Jan. 19, 2004 (KR) .................. 10-2004-0003891

(51) Int. Cl.
*H01L 21/00* (2006.01)

(52) U.S. Cl. .................. 438/31; 438/29; 438/39
(58) Field of Classification Search .................. 438/29, 438/31, 39, 40, 41, 455, 458, 459, 464
See application file for complete search history.

(56) References Cited

U.S. PATENT DOCUMENTS

| 6,455,340 | B1 * | 9/2002 | Chua et al. ............ 438/31 |
| 6,757,314 | B1 * | 6/2004 | Kneissl et al. ....... 257/E21.122 |
| 6,800,500 | B1 * | 10/2004 | Coman et al. .......... 438/22 |
| 6,815,312 | B1 * | 11/2004 | Furukawa et al. ...... 438/455 |
| 6,900,069 | B1 * | 5/2005 | Kaneko et al. ......... 438/39 |

\* cited by examiner

*Primary Examiner*—Kevin M. Picardat
(74) *Attorney, Agent, or Firm*—Birch, Stewart, Kolasch & Birch, LLP

(57) ABSTRACT

Provided is a nitride semiconductor laser diode and a method for manufacturing the same. The method includes the steps of: a) forming a nitride semiconductor layer by orderly evaporating a substrate, an undoped GaN layer, an n-type layer, a multi-quantum well (MQW), an electron blocking layer (EBL) and a p-type layer; b) eliminating the substrate and the undoped GaN layer in the nitride semiconductor layer by lapping the substrate and the undoped GaN layer; and c) forming a ridge structure on the n-type layer. According to the present invention, a ridge structure is easily formed on an n-type layer, I-V characteristics are improved, heat generation is suppressed and an operational lifetime is extended.

25 Claims, 3 Drawing Sheets

NITRIDE SEMICONDUCTOR LASER DIODE AND METHOD FOR MANUFACTURING THE SAME

This application claims the benefit of the Korean Application No. 10-2004-0003891 filed on Jan. 19, 2004, which is hereby incorporated by reference.

BACKGROUND OF THE INVENTION

1. Field of the Invention

The present invention relates to a nitride semiconductor laser diode, and more particularly, to a method for manufacturing a nitride semiconductor laser diode having a ridge structure on an n-type layer.

2. Discussion of the Related Art

Generally, a nitride semiconductor laser diode has been developed and manufactured to be applied to a mass information storage device and a color printer. Also, there have been various applications introduced by using the nitride semiconductor laser diode.

For applying the nitride semiconductor laser diode to the mass information storage device and the color printer, the nitride semiconductor laser diode is required to have characteristics including low threshold current (Ith), high external quantum efficiency ($\eta_{ex}$) and low operating voltage ($V_{op}$) for providing high reliability related to a lifetime and low power consumption.

The low operating voltage is a major factor to be improved in the nitride semiconductor laser diode. That is, a current-voltage characteristic (I-V) of the nitride semiconductor laser diode must be improved.

A conventional nitride semiconductor laser diode will be described below with reference to FIG. 1.

FIG. 1 is a cross-sectional view of a conventional nitride semiconductor laser diode. As shown in FIG. 1, the conventional nitride semiconductor laser diode includes an undoped GaN layer 1 formed on a substrate (not shown) made of a GaN or a sapphire, an n-GaN layer 2, a compliance layer (InGaN) 3, an n-cladding layer (n-ALGaN) 4, an n-waveguide (GaN) layer 5, a multi-quantum well (MQW) 6, an electron blocking layer (EBL) 7, a p-waveguide layer (GaN) 8, a p-cladding layer (p-AlGaN) 9, a capping layer (p-GaN) 10, and a p-pad metal layer (not shown) formed on the capping layer 10.

In FIG. 1, the n-GaN layer 2 is extended to a right and a left directions with a substrate (not shown) and an exposed n-pad metal layer (not shown) is formed by mesa etching the expended the n-GaN layer 2 and the substrate (not shown).

The conventional nitride semiconductor laser diode is a p-n diode form. That is, the conventional nitride semiconductor laser diode includes the multi-quantum well MQW 6 emitting lights, and GaN waveguide layers 5 and 8 and AlGaN cladding layers 4, 9 formed by surrounding the multi-quantum well 6 as a center.

The nitride semiconductor laser diode receives current from the p-pad metal layer (not shown) and emits the lights by coupling an electron and a hole at the MQW 6. The light is externally radiated through the capping layer (p-GaN) 10.

When emitting the light, the GaN waveguide layers 5, 8 and the AlGaN Cladding layers 4, 9 concentrate the electron and the hole in the MQW 6 and guide the emitted lights.

For effectively emitting a laser beam and improving beam characteristics of a laser diode, a ridge structure has been implemented to a nitride semiconductor laser diode.

FIG. 2 is a cross-sectional view of a conventional nitride semiconductor laser diode having a ridge structure.

As shown in FIG. 2, the nitride semiconductor laser diode having the ridge structure includes: a p-cladding layer 9 formed on an MQW 6, a EBL 7 and a P-waveguide layer 8, where a center part of the p-cladding layer 9 is projected and the MQW 6, the EBL 7 and the P-waveguide layer 8 are identical to the same of FIG. 1; a capping layer 10 formed on an upper surface of the projected part of p-cladding layer 9; and an ohmic contact metal 11 formed on the capping layer 10. In FIG. 2, the projected part of the p-cladding layer 9, the capping layer 10 and the ohmic contact metal layer 11 are formed the ridge structure.

The ridge structure is generally manufactured to have a width less than 3 μm and a current from the p-pad metal layer 13 is flowed through the ridge structure.

An insulating layer 12 is formed at side surfaces of the ridge structure and on an upper surface of the p-waveguide layer 8. After forming the insulating layer 12, a p-pad metal layer 13 is formed on the insulating layer 12 and the ohmic contact metal layer 11.

According to the above-mentioned related art, the ridge structure is generally formed on the p-type layers 8, 9 and 10.

When the p-type layer is grown, a magnesium Mg is used as a dopant. The p-type layer must be formed after forming the n-type layer, the waveguide layer and the MQW because the Mg has a memory effect. Accordingly, it is structurally simple and convenient to form the ridge structure on the p-type layer.

However, the nitride has a large band gap, a low carrier concentration and a low mobility. Therefore, it is difficult to form the ohmic contact metal layer 11 comparing to other compound semiconductor.

Also, a resistance seriously increases since the p-type layer has low carrier concentration and low mobility comparing to the n-type layer and it is difficult to form the ohmic contact metal 11.

Furthermore, the ridge structure according to the related art causes sudden increase of element resistance. It degrades I-V characteristics of the nitride semiconductor laser diode.

The increase of resistance induces to increase an operating voltage and causes to generate heat from a part of the ridge contacted to the p-pad metal. Therefore, the p-ohmic metal and element characteristics are degraded and the reliability of the laser diode such as the lift time decreases.

SUMMARY OF THE INVENTION

Accordingly, the present invention is directed to a nitride semiconductor laser diode having a ridge structure on an n-type layer and a method for manufacturing the same that substantially obviates one or more problems due to limitations and disadvantages of the related art.

An object of the present invention is to provide a method for manufacturing a nitride semiconductor laser diode having a ridge structure formed on an n-type layer instead of forming the ridge structure on a p-type layer having comparatively large resistance and a difficulty to form an ohmic contact layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for manufacturing a nitride semiconductor laser diode, the method including the steps of: a) forming a nitride semiconductor layer by orderly evaporating a substrate, an undoped GaN layer, an n-type layer, a multi-quantum well (MQW), an electron blocking layer (EBL) and a p-type layer; b) eliminating the substrate and the undoped GaN layer in the nitride semiconductor layer by lapping the substrate and the undoped GaN layer; and c) forming a ridge structure on the n-type layer.

The method may further include the step of d) fixing the nitride semiconductor layer by using a fixing substrate, wherein the fixing substrate is bonded on an upper side of the p-type layer.

The step of fixing the nitride semiconductor layer may include the steps of: d-1) evaporating a p-ohmic metal on an upper side of the p-type layer; d-2) evaporating a pad-metal and a bonding metal on an upper side of the p-ohmic metal; d-3) bonding the bonding metal to the fixing substrate; and d-4) fixing the bonding metal evaporated fixing substrate to the pad metal and the bonding metal by compressing and thermal processing.

The step of fixing the nitride semiconductor layer may further include the step of d-5) performing a thermal process for making an ohmic state between the p-GaN layer on the p-type layer and the p-ohmic metal layer.

The step of forming the ridge structure may include the steps of: c-1) eliminating predetermined portions of a right and a left sides of the n-type layer by etching the right and the left sides of the n-type layer for remaining a center portion of the n-type layer; and c-2) evaporating an insulating layer on the eliminated sides of the n-type layer.

In another aspect of the present invention, there is provided a nitride semiconductor laser diode including an n-type layer, an activate layer, an EBL and a p-type layer, wherein the n-type layer has a ridge structure.

Accordingly, the present invention provides a method for easily forming a ridge structure on an n-type layer, improving I-V characteristics, suppressing heat generation and extending an operational lifetime.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 3:
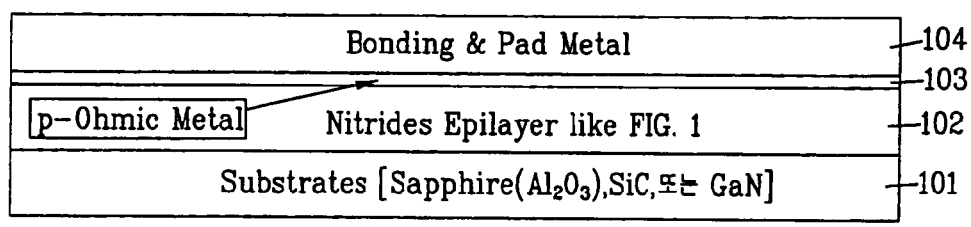
FIGS. 3 to 5 are diagrams showing a nitride semiconductor laser diode having a ridge structure on an n-type layer for explaining a method for manufacturing the same in accordance with a preferred embodiment of the present invention.
Figure 4:
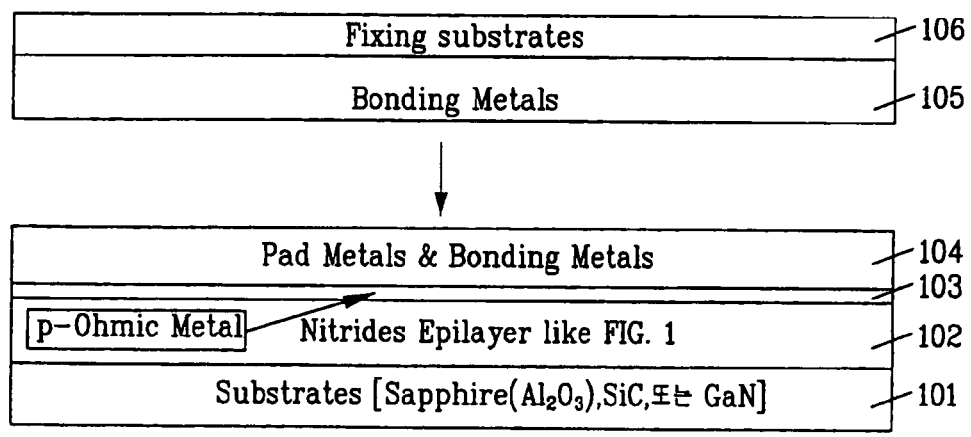
Figure 5:
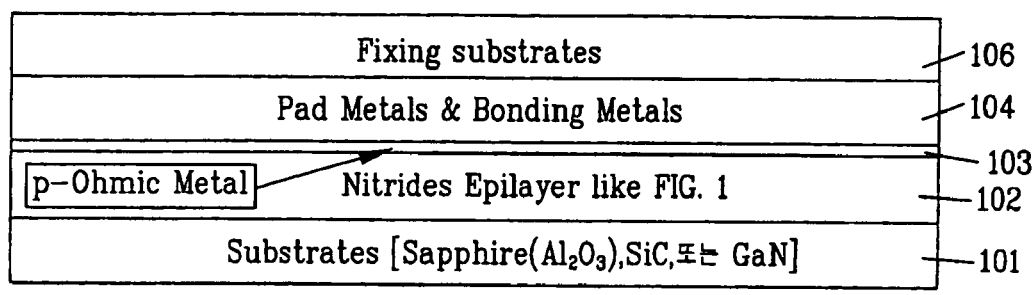

FIGS. 3 to 5 are diagrams for explaining a method for manufacturing a nitride semiconductor laser diode having a ridge structure on an n-type layer by using a wafer bonding technique in accordance with a preferred embodiment of the present invention.

Figure 1:
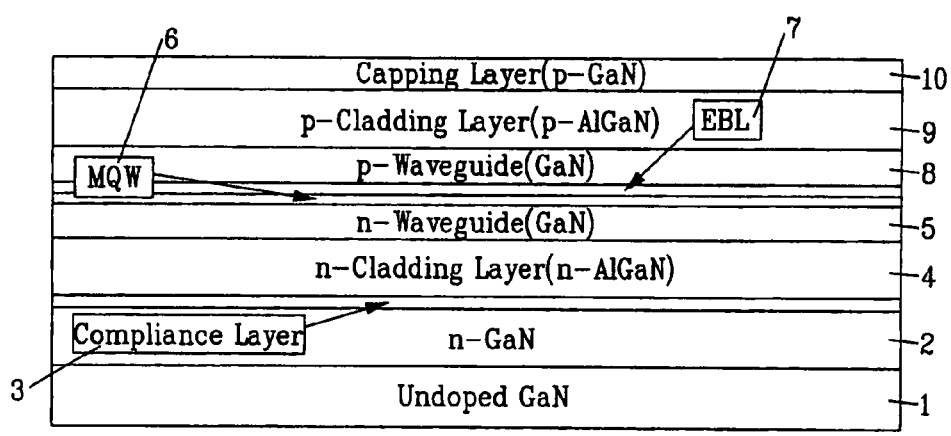
FIG. 1 is a diagram of a conventional nitride semiconductor laser diode.
Figure 2:
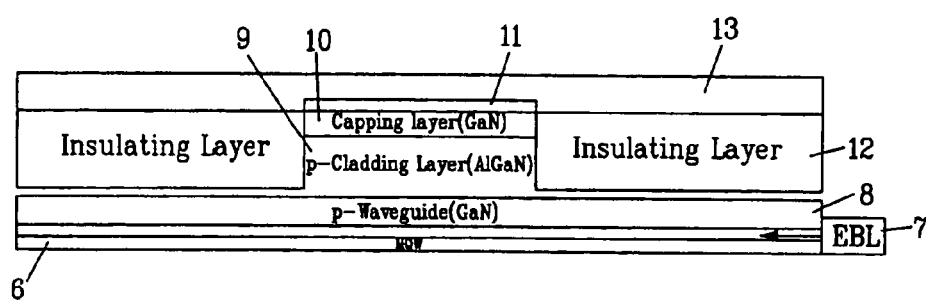
FIG. 2 is a diagram of a conventional nitride semiconductor laser diode having a ridge structure.

As shown in FIG. 3, a nitride epilayer 102 shown in FIG. 1 is formed on substrate 101 made of a sapphire (A1203), SiC or a GaN 1 at first.

That is, a GaN layer (undoped GaN), an n-GaN layer, a compliance layer (InGaN), an n-cladding layer (n-ALGaN)), an n-waveguide (GaN) layer, a multi-quantum well (MQW), an electron blocking layer (EBL), a p-waveguide (GaN) layer a p-cladding layer (P-AlGaN) and a capping layer (P-GaN) are orderly formed on the substrates 101.

After forming the capping layer (P-GaN), a p-ohmic metal layer 103 is evaporated on the nitride epilayer 102. A metal is generally used as the p-Ohmic metal layer 103. However, the p-ohmic metal layer 103 may be formed by using a conductive material adjustable to a wavefunction of the p-layer.

After evaporating the p-ohmic metal layer 103, a pad metal and a bonding metal 104 are evaporated on the p-ohmic metal layer 103.

A thermal treatment is performed for making an ohmic state between the capping layer (P-GaN) and the P-Ohmic metal 103. However, the thermal treatment may be not performed after evaporating the pad metal and the bonding metal 104. The ohmic state may be made by a later thermal treatment for bonding fixing substrate 106 and a nitride structure.

After performing the thermal treatment, the bonding metal 105 is evaporated on a fixing substrate 106. The fixing substrate 106 is used for fixing the evaporated structure shown in FIG. 3 and a GaAs or a Si is generally used for the fixing substrate 106.

The bonding metal 105 evaporated fixing substrate 106 is coupled to the nitride structure of FIG. 3 by compressed and thermal processed as shown in FIG. 5.

During the coupling, the ohmic state between the capping layer (P-GaN) and the p-ohmic metal 103 may be made by the thermal process.

As shown in FIG. 5, an n-type layer may be exposed by lapping an undoped GaN layer in the nitride epilayer 102 and the substrate layer 101.

For reducing damages on the n-type layer caused by lapping, a Reactive Ion Etching process and a thermal process are performed. The RIE and thermal process are performed for preventing an ohmic contact between an n-pad metal and n-type layer. That is, it prevents increase of contact resistivity.

After eliminating the sacrificial layer, i.e., the undoped GaN layer, predetermined portions of a left side and a right side of the exposed n-type layer are eliminated by etching the predetermined portions of the left and the right sides of the exposed n-type layer. That is, a center part of the exposed n-type layer is left.

In other words, the exposed n-type layer is etched for projecting a center part of the n-type layer including the n-GaN layer, the InGaN layer and the n-cladding layer. That is, a ridge structure is formed at center part of the n-type layer.

After etching, an insulating layer is evaporated on the right and the left sides of the exposed n-type. After forming the insulating layer, an n-pad metal is evaporated on the insulating layer and the ridge structure.

Figure 6:
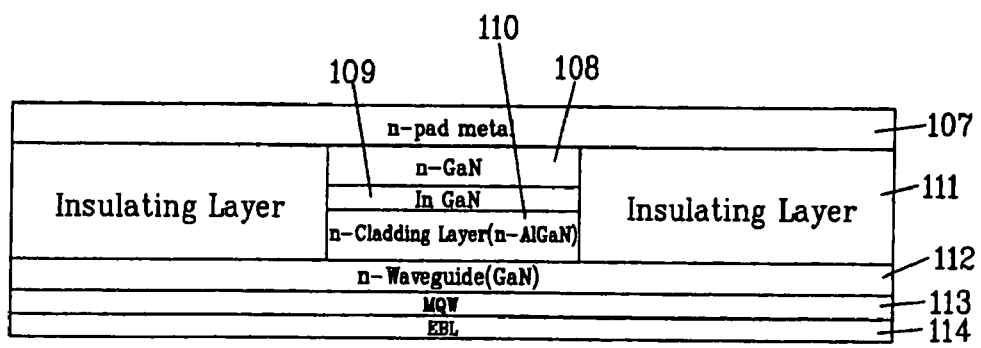
FIG. 6 is a cross-sectional view illustrating a nitride semiconductor laser diode having a ridge structure formed on an n-type layer in accordance with a preferred embodiment of the present invention.

FIG. 6 shows a nitride semiconductor layer diode including a ridge structure on an n-type layer manufactured by the above mentioned method.

As shown in FIG. 6, an n-cladding layer 110 having a ridge structure is formed on a center of an n-waveguide (GaN) layer 112. The n-waveguide layer 112 is formed on a multi-quantum well (MQW) 113 and an electron blocking layer (EBL) 114. On the n-cladding layer 110, an InGaN layer 109, an n-GaN layer 108 are orderly evaporated to form the ridge structure.

And, an insulating layer 111 is formed at the sides of the ridge structure and on the n-waveguide layer 112. An n-pad metal layer 107 is formed on the insulating layer 111 and the n-GaN layer 108.

As mentioned above, the ridge structure is formed on the n-type layer in the present invention, where the n-type layer has a superior carrier concentration characteristics and a superior mobility comparing to a p-type layer. Therefore, a resistance becomes decreased (the carrier concentration and the mobility is reverse proportional to the resistance) and it becomes easy to form the ohmic contact metal layer 108.

After forming the ridge structure as mentioned above, processes are formed to manufacture a laser diode package by using a junction-up/down or top-down method.

As mentioned above, the present invention provides a method easily forming the ridge structure on the n-type layer by fixing the nitride semiconductor layer by using the fixing substrate.

Also, the present invention increases I–V characteristics of elements, suppresses heat generation and extends the lifetime by forming the ridge structure on the n-type layer.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a nitride semiconductor laser diode, the method comprising the steps of:
    a) forming a nitride semiconductor layer by orderly evaporating a substrate, an undoped GaN layer, an n-type layer, a multi-quantum well (MQW), an electron blocking layer (EBL) and a p-type layer;
    b) eliminating the substrate and the undoped GaN layer in the nitride semiconductor layer; and
    c) patterning the n-type layer to form a ridge structure.

2. The method of claim 1, further comprising the step of d) fixing the nitride semiconductor layer by using a fixing substrate.

3. The method of claim 2, wherein the fixing substrate is bonded on an upper side of the p-type layer.

4. The method of claim 2, wherein the nitride semiconductor layer is fixed by the fixing substrate before eliminating the substrate and the undoped GaN layer.

5. The method of claim 2, wherein the fixing substrate is made of a GaAs or a Si having high thermal conductivity.

6. The method of claim 2, wherein the step d) includes the steps of:
    d-1) evaporating a p-ohmic metal on an upper side of the p-type layer;
    d-2) evaporating a pad-metal and a bonding metal on an upper side of the p-ohmic metal;
    d-3) bonding the bonding metal to the fixing substrate; and
    d-4) fixing the bonding metal evaporated fixing substrate to the pad metal and the bonding metal by compressing and thermal processing.

7. The method of claim 6, wherein the step d) further includes the step of d-5) performing a thermal process for making an ohmic state between the p-GaN layer on the p-type layer and the p-ohmic metal layer.

8. The method of claim 1, the method further comprising the step of e) performing a reactive ion etching (RIE) process and a thermal process for reducing loss of the eliminated side.

9. The method of claim 1, the step c) includes the steps of:
    c-1) eliminating predetermined portions of a right and a left sides of the n-type layer by etching the right and the left sides of the n-type layer for remaining a center portion of the n-type layer; and
    c-2) evaporating an insulating layer on the eliminated sides of the n-type layer.

10. The method of claim 9, wherein the left and the right sides eliminated n-type layer is an n-cladding layer, an InGaN layer and n-GaN layer.

11. The method of claim 1, further comprising the step f) of forming an n-pad metal on an upper side of the ridge structure.

12. The method of claim 1, wherein the step (c) includes forming the ridge structure made of the n-type layer to partially cover a top surface of the p-type layer.

13. The method of claim 12, wherein in the step (c), a sidewall of the ridge structure made of the n-type layer is not aligned with a sidewall of the p-type layer.

14. The method of claim 1, wherein in the step (a), the n-type layer includes a stack of an n-cladding layer, an InGaN layer and n-GaN layer, and the step (c) includes removing a side portion of the stack of the n-cladding layer, the InGaN layer and the n-GaN layer to form the ridge structure consisting of a remainder of the n-cladding layer, the InGaN layer and the n-GaN layer.

15. The method of claim 14, wherein in the step (a), the n-type layer further includes an n-waveguide above the p-type layer and below the stack of the n-cladding layer, the InGaN layer and the n-GaN layer, and the step (c) includes removing the side portion of the stack of the n-cladding layer, the InGaN layer and the n-GaN layer until exposing a top surface of the n-waveguide.

16. The method of claim 14, wherein the step (c) includes keeping the p-type layer free of removal when forming the ridge structure.

17. The method of claim 14, further comprising:
    (e) forming an insulating layer surrounding a sidewall of the ridge structure; and
    (f) forming an n-pad metal layer covering a top surface of the ridge structure and a top surface of the insulating layer.

18. A method for manufacturing a nitride semiconductor laser diode, the method comprising:
    (a) forming a nitride semiconductor layer having an n-type layer and a sacrificial layer below the n-type layer;

(b) fixing the nitride semiconductor layer by using a fixing substrate;
(c) removing the sacrificial layer; and
(d) patterning the n-type layer to form a ridge structure made of the n-type layer to partially cover a top surface of a p-type layer.

19. The method of claim 18, wherein the sacrificial layer includes an undoped GaN layer.

20. The method of claim 18, wherein the step (d) includes the steps of:
   (d-1) eliminating predetermined portions of a right side and a left side of the n-type layer for remaining a center part of the n-type layer left by etching the predetermined portions of the right and the left sides of the n-type layer; and
   (d-2) evaporating an insulating layer on the eliminated right and left sides of the n-type layer.

21. The method of claim 18, wherein in the step (c), a sidewall of the ridge structure made of the n-type layer is not aligned with a sidewall of the p-type layer.

22. The method of claim 18, wherein in the step (a), the n-type layer includes a stack of an n-cladding layer, an InGaN layer and n-GaN layer, and the step c) includes removing a side portion of the stack of the n-cladding layer, the InGaN layer and the n-GaN layer to form the ridge structure consisting of a remainder of the n-cladding layer, the InGaN layer and the n-GaN layer.

23. The method of claim 22, wherein in the step (a), the n-type layer further includes an n-waveguide above the p-type layer and below the stack of the n-cladding layer, the InGaN layer and the n-GaN layer, and the step (c) includes removing the side portion of the stack of the n-cladding layer, the InGaN layer and the n-GaN layer until exposing a top surface of the n-waveguide.

24. The method of claim 22, wherein the step (c) includes keeping the p-type layer free of removal when forming the ridge structure.

25. The method of claim 22, further comprising:
   (e) forming an insulating layer surrounding a sidewall of the ridge structure; and
   (f) forming an n-pad metal layer covering a top surface of the ridge structure and a top surface of the insulating layer.

* * * * *